United States Patent [19]

Ishii

[11] Patent Number: 5,789,991

[45] Date of Patent: Aug. 4, 1998

[54] FSK MODULATING AND DEMODULATING APPARATUS WHEREIN EACH BINARY DATA IS REPRESENTED BY SAME NUMBER OF CYCLES OF MODULATED SIGNAL

[75] Inventor: Eiichi Ishii, Tokyo, Japan

[73] Assignee: Nippon Steel Corporation, Tokyo, Japan

[21] Appl. No.: 770,305

[22] Filed: Dec. 20, 1996

[30] Foreign Application Priority Data

Dec. 27, 1995 [JP] Japan ................................. 7-351819

[51] Int. Cl.$^6$ ........................... H03C 3/00; H03D 3/00; H04L 27/12; H04L 27/14
[52] U.S. Cl. ................ 332/100; 332/101; 329/300; 329/302; 329/303; 375/272; 375/276; 375/303; 375/306; 375/324; 375/334
[58] Field of Search .................... 332/100–102; 329/300–303; 360/30; 375/272–278, 303–307, 324, 334–337

[56] References Cited

U.S. PATENT DOCUMENTS 3,614,639 10/1971 Belman ............................. 329/300
4,021,744 5/1977 Montefusco ....................... 329/300
4,547,751 10/1985 Nakata et al. ..................... 332/100

FOREIGN PATENT DOCUMENTS

A-63-200652 8/1988 Japan.

*Primary Examiner*—David Mis
*Attorney, Agent, or Firm*—Pollock, Vande Sande & Priddy

[57] ABSTRACT

A signal FSK-modulated with a binary data signal has first signal portions representing first logical level data contained in the binary data signal and second signal portions representing second logical level data contained in the binary data signal. Each of the first signal portions has a first frequency and lasts for a first time period and each of the second signal portions has a second frequency and lasts for a second time period. These first and second time periods are determined such that a number of cycles of the FSK-modulated signal appearing in each of the first time periods is equal to a number of cycles of the FSK-modulated signal appearing in each of the second time periods. For demodulation of the FSK-modulated signal, a time period corresponding to a predetermined number of successively appearing cycles of the modulated signal, among those appearing during the whole of each signal portion, is established, clock pulses from a clock pulse source are counted for the established time period, and the resulting count values are compared to determine whether received data is a first logical level data or second logical level data.

16 Claims, 9 Drawing Sheets

PRIOR ART

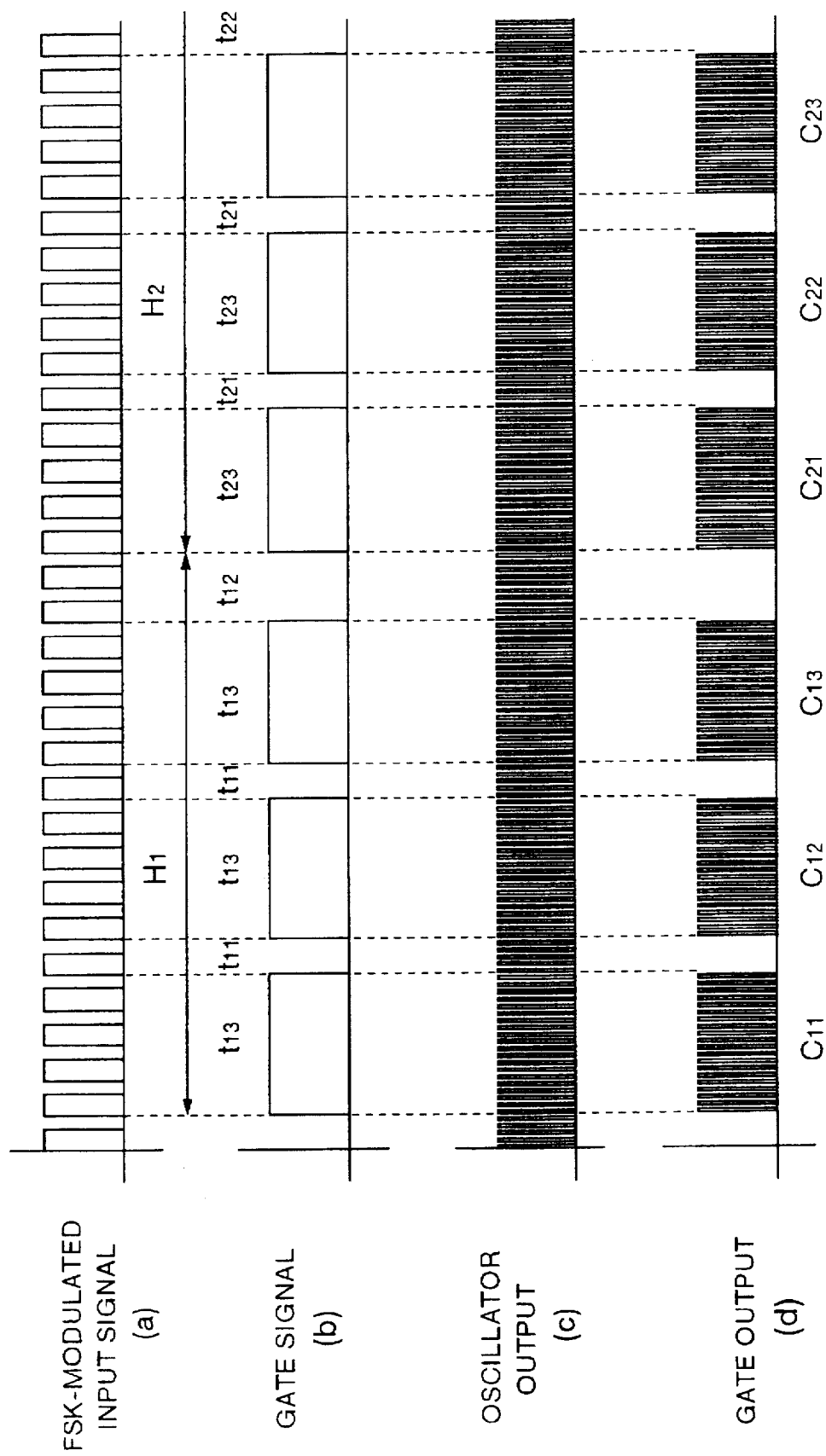

FSK MODULATING AND DEMODULATING APPARATUS WHEREIN EACH BINARY DATA IS REPRESENTED BY SAME NUMBER OF CYCLES OF MODULATED SIGNAL

BACKGROUND OF THE INVENTION

The present invention relates to a frequency-shift keying modulation apparatus, and more particularly, to a FSK modulation apparatus which is effective to transmit signals to a contactless IC card.

The present invention also relates to an apparatus for demodulating a FSK-modulated signal which represents binary data by a combination of two signals at frequencies different from each other.

Generally, the digital data transmission, and so on employs binary signals "1" and "0". One of modulation scheme for transmitting the binary signal is frequency shift keying which is resistant to noise. The frequency shift keying changes the frequency of a carrier signal between a higher frequency $F_{HIGH}$ and a lower frequency $F_{LOW}$ corresponding to binary value data "1" and "0" of a digital signal, and is well known in the art.

In conventional FSK modulation schemes, for generating a FSK-modulated signal including a signal portion at a higher frequency $F_{HIGH}$ and a signal portion at a lower frequency $F_{LOW}$ corresponding to "1" and "0" of digital data, the duration of the signal portion representing a unit of data is made constant. Further, there has been an example which makes the phase of adjacent data continuous at the boundary thereof for reducing a signal bandwidth to increase transmission efficiency.

FIG. 1 illustrates a prior art example of a FSK modulation apparatus. In the FSK modulation apparatus, a first oscillator $OSC_1$ generates a higher frequency $F_{HIGH}$, and a second oscillator $OSC_2$ generates a lower frequency $F_{LOW}$. Then, a multiplexer MPX switches the frequencies generated by the two oscillators $OSC_1$, $OSC_2$ corresponding to "1" and "0" of a digital signal inputted from a data input terminal IN.

For demodulating a FSK-modulated digital signal outputted from a data output terminal OUT of the FSK modulation apparatus as mentioned above, FSK demodulation apparatus is employed. The FSK demodulation apparatus, however, requires an oscillator for ensuring a stable clock as a reference for frequency or as a reference for cycle, as well as a phase circuit composed of a tuning circuit and so on.

When a FM detector circuit, for example, is employed in a FSK demodulation apparatus, a detecting coil and a phase circuit are required in each of a ratio detector circuit, a Foster-Sealey discriminator circuit, demodulating/tuning detector circuit, a quadrature detector circuit, a peak detector circuit, and so on. In addition, when a PLL circuit and a beat detector circuit are employed, a stable oscillator is required. Further, if data transmission is necessary as is the case of a contactless IC card, a stable oscillator is employed to produce a reference for a stable cycle required to establish bit synchronization or word synchronization.

When a pulse count detector circuit is employed, the demodulation apparatus itself does not require a tuning coil or a stable oscillator. However, if a frequency changing swing is small in the FSK modulation, this results in a small changing swing of a detected output. For this reason, analog circuits are required to frequency convert an input signal to increase the ratio of the changing swing or to enable processing of a signal having a small amplitude.

A prior art example of a FSK demodulation apparatus employing an oscillator for generating a stable reference pulse is illustrated in FIG. 2. In FIG. 2, a beat detector circuit is employed.

In FIG. 2, an oscillating frequency $f_{OSC}$ of an oscillator OSC is set substantially in the middle of a higher frequency $F_{HIGH}$ and a lower frequency $F_{LOW}$ of a FSK-modulated signal (data signal) inputted from an input terminal S. A reference pulse at frequency $f_{OSC}$ outputted from the oscillator OSC is directly supplied to a first mixer circuit $MIX_1$ and also supplied to a second mixer circuit $MIX_2$ after its phase is shifted by an angular distance of 90° by a phase shifting circuit PH.

The FSK-modulated signal inputted from the input terminal S is frequency converted by the first and second mixer circuits $MIX_1$ and $MIX_2$, respectively, in accordance with pulses supplied thereto from the oscillator OSC and the phase shifting circuit PH. The signals, frequency converted by the first and second mixer circuits $MIX_1$ $MIX_2$ are supplied to first and second low-pass filters $LPF_1$, $LPF_2$, respectively.

Then, the signals, subjected to predetermined filtering in the first and second low-pass filters $LPF_1$, $LPF_2$, are amplified and wave shaped in first and second wave shaping circuits $AMP_1$, $AMP_2$, and supplied to a decision circuit $D_{OUT}$. The decision circuit $D_{OUT}$ determines whether the frequency of an inputted signal is at the higher frequency $F_{HIGH}$ or at the lower frequency $F_{LOW}$ and outputs the determination result.

The determination at the decision circuit $D_{OUT}$ is made based on whether the output signal of the second wave shaping circuit $AMP_2$ is positive or negative when the output signal of the first wave shaping circuit $AMP_1$ rises and falls, and whether the output signal of the first wave shaping circuit $AMP_1$ is positive or negative when the output signal of the second wave shaping circuit $AMP_2$ rises and falls.

Also, the oscillating output of the oscillator OSC is supplied as a clock system for the system, and in some cases constitutes a PLL using a phase feedback to establish synchronization with the data signal.

The exemplary beat detector circuit illustrated in FIG. 2 is suitable for applications to integrated circuits since a data signal inputted from the input terminal S is first frequency converted to be a signal at a lower frequency. Also, a contactless IC card is configured to extract electric power for operating the card from a detecting coil which receives the data signal, and the data signal is received at a sufficiently high level so that external disturbance due to noise seldom causes significant problems.

However, the oscillating frequency $f_{OSC}$ of the oscillator OSC in the demodulation apparatus must be set substantially in the middle of the higher frequency $F_{HIGH}$ and the lower frequency $F_{LOW}$ of a FSK-modulated input signal. To meet this requirement, the oscillator OSC needs to be a stable oscillator employing a solid-state oscillating element such as quartz, an oscillating coil, and so on, and needs to adjust its oscillating frequency.

In addition, since the demodulation apparatus requires analog circuits such as the first and second mixer circuits $MIX_1$, $MIX_2$, the phase shifting circuit PH, the first and second low-pass filters $LPF_1$, $LPF_2$, and so on, it is difficult to implement it in the form of an integrated circuit by CMOS processes which are appropriate to logic circuits.

An apparatus similar to the demodulation apparatus illustrated in FIG. 2 is disclosed, for example, in JP-A-63-200652 (laid open on Aug. 18, 1988).

SUMMARY OF THE INVENTION

It is an object of the present invention to provide a FSK modulation apparatus which is capable of eliminating the need for adjusting the oscillating frequency of an oscillator used to demodulate a FSK-modulated signal.

It is another object of the present invention to provide a FSK demodulation apparatus which eliminates external parts and hence adjustments thereto, achieves stable operations, and can be implemented in the form of IC.

It is a further object of the present invention to provide a FSK demodulation apparatus which is easily manufactured in CMOS processes.

According to one aspect of the present invention, a single oscillator is employed as a carrier generator, and a carrier signal generated by this carrier generator is supplied to a frequency divider having a variable rate of frequency division, so that the rate of frequency division of the frequency divider is switched in accordance with a binary data signal to frequency (FSK) modulate the carrier signal therewith. In this event, the switching timing of the rate of frequency division is controlled to equal the number of cycles of the frequency modulated (FSK-modulated) carrier signal corresponding to each bit of the binary data signal.

According to another aspect of the present invention, a FSK demodulation apparatus comprises a clock pulse source, a gate for selectively supplying a clock signal from the clock pulse source to a counter in accordance with a gate signal, a gate signal generator for generating the gate signal including a plurality of gate pulses each having a duration corresponding to an inter number of cycles of a FSK-modulated input signal, and a comparator for determining the frequency of the FSK-modulated input signal based on a value represented by a count signal which is generated by the counter every time a gate pulse is inputted thereto.

The counter counts the number of clock signals (clock pulses) fetched during a time corresponding to an integer number of cycles of a FSK-modulated input signal for each gate pulse of the gate signal. The FSK demodulation apparatus takes advantage of the fact that the count value differs depending on the frequency of the input signal.

Alternatively, the counter counts the input signal during a time corresponding to an integer number of cycles of the clock signal. The FSK demodulation apparatus takes advantage of the fact that the count value differs depending on the frequency of the FSK-modulated input signal. Then, a determination is made as to which frequency of a signal is inputted by sequentially making comparisons based on newly produced count values from among a multiplicity of continuously produced count values, so that the oscillator, i.e., the clock pulse source is not required to have a long-term stability. Thus, the oscillator does not need adjustments or any external parts, thereby facilitating the fabrication thereof into an integrated circuit.

BRIEF DESCRIPTION OF THE DRAWINGS

FIG. 7 is a waveform diagram for explaining the operation of the FSK demodulation apparatus according to the embodiment of the present invention;

DESCRIPTION OF THE PREFERRED EMBODIMENTS

Figure 3:
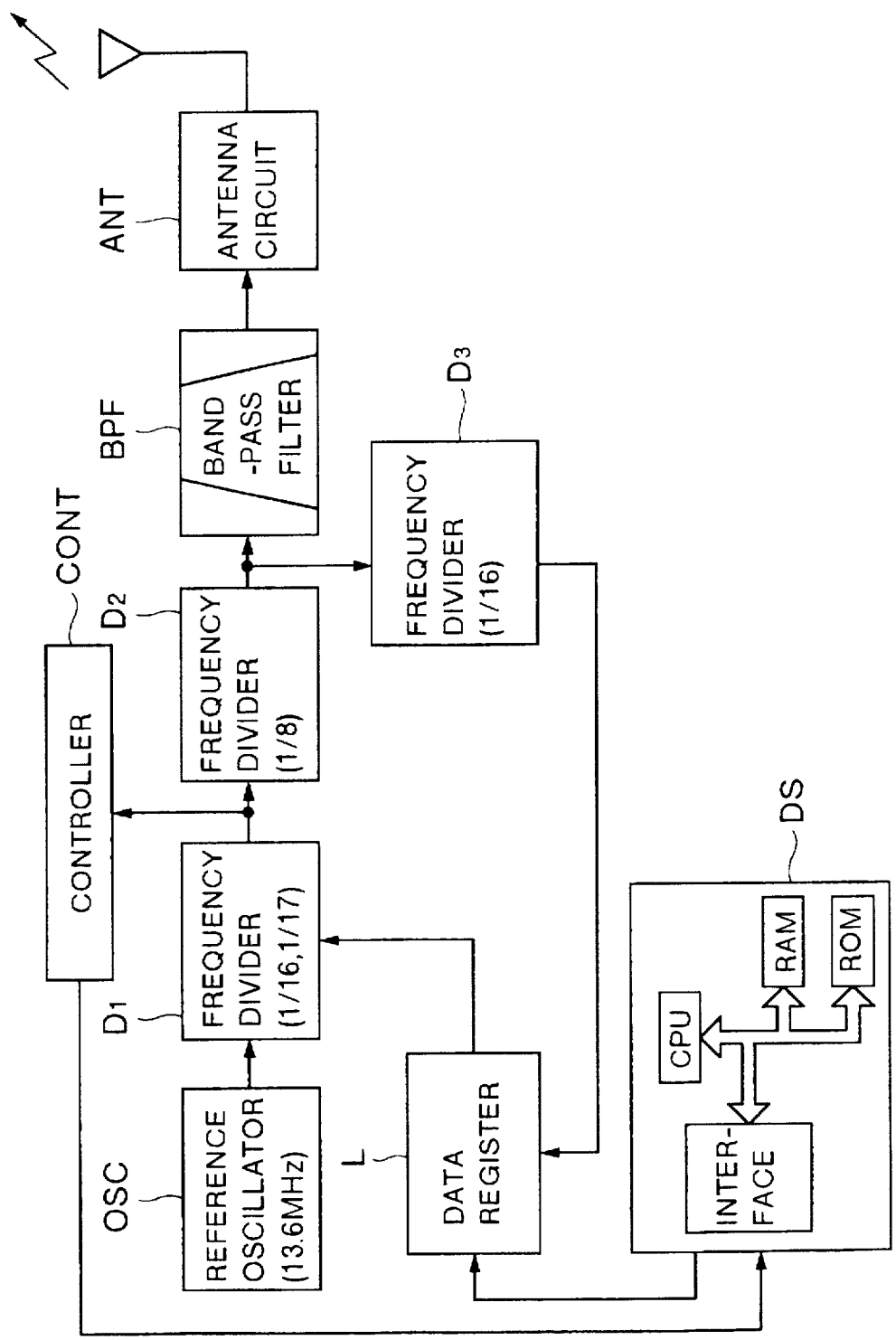
FIG. 3 is a block diagram of a FSK modulation apparatus according to one embodiment of the present invention.

FIG. 3 illustrates a FSK modulation apparatus according to one embodiment of the present invention. In this figure, the oscillating frequency of a reference oscillator (carrier generator) is, for example, at 13.6 MHz.

A reference clock signal (carrier signal) at a frequency of 13.6 MHz outputted from the reference oscillator OSC is supplied to a first frequency divider D1 having a variable rate of frequency division. The first frequency divider D1 divides the frequency of the reference clock by switching the rate of frequency division, for example, between 16 and 17 in accordance with a predetermined control signal.

A data register L stores, for example, binary FSK-modulated data. A data signal including data outputted from the data register L is supplied to a frequency division control terminal (labelled "C" in FIG. 4) of the first frequency divider D1. The switching of the rate of frequency division in the first frequency divider D1 is performed based on this data signal. An output signal of the first frequency divider D1 is supplied to a second frequency divider D2 which, performs a division-by-eight operation, and to a controller CONT as a clock signal for the whole system.

An output signal of the second frequency divider D2 is outputted through a band-pass filter BPF and to a third frequency divider D3 which performs a division-by-16 operation. An output signal of the third frequency divider D3 is then supplied to a clock terminal (not shown) of the data register L as a data signal (timing signal). Also, a signal outputted from the band-pass filter BPF is supplied to an antenna circuit ANT for data transmission.

The controller CONT and the data register L are connected to a data supply source 1. The supply source 1 may be implemented by a general microcontroller or the like which has a CPU, a RAM, a ROM, an interface, and so on which are interconnected by a bus. However, this is a mere example, and the present invention is not limited to this configuration as long as binary signals "0" and "1" are generated as modulated data. The data register L and the supply source 1 constitute a binary data signal source.

The operation of the FSK modulation apparatus configured as described above will be explained below.

First, a binary signal comprising "0" and "1" commensurate with data to be transmitted is sequentially supplied from the data supply source 1 to the data register L. Meanwhile, the reference clock signal (carrier signal) outputted from the reference oscillator OSC is supplied to the first frequency divider D1 for frequency division, wherein the rate of frequency division is switched between 16 and 17 in accordance with a data signal (control signal) supplied from the data register L to the frequency division control terminal of the first frequency divider D1.

The control signal (data signal) for switching the ratio of frequency division of the first frequency divider D1 is supplied from the data register L to the first frequency divider D1 in synchronism with a signal produced by frequency dividing the output signal of the first frequency divider D1 by eight by the second frequency divider D2, and frequency dividing the output signal of the second frequency divider D2 by 16 by the third frequency divider, i.e., a signal produced by frequency dividing the output signal of the first frequency divider D1 by 128. Therefore, the number of waves, i.e., the number of cycles of the reference signal (carrier signal) appearing during the duration of the data is constant irrespective of whether the data is "0" or "1".

Figure 4:
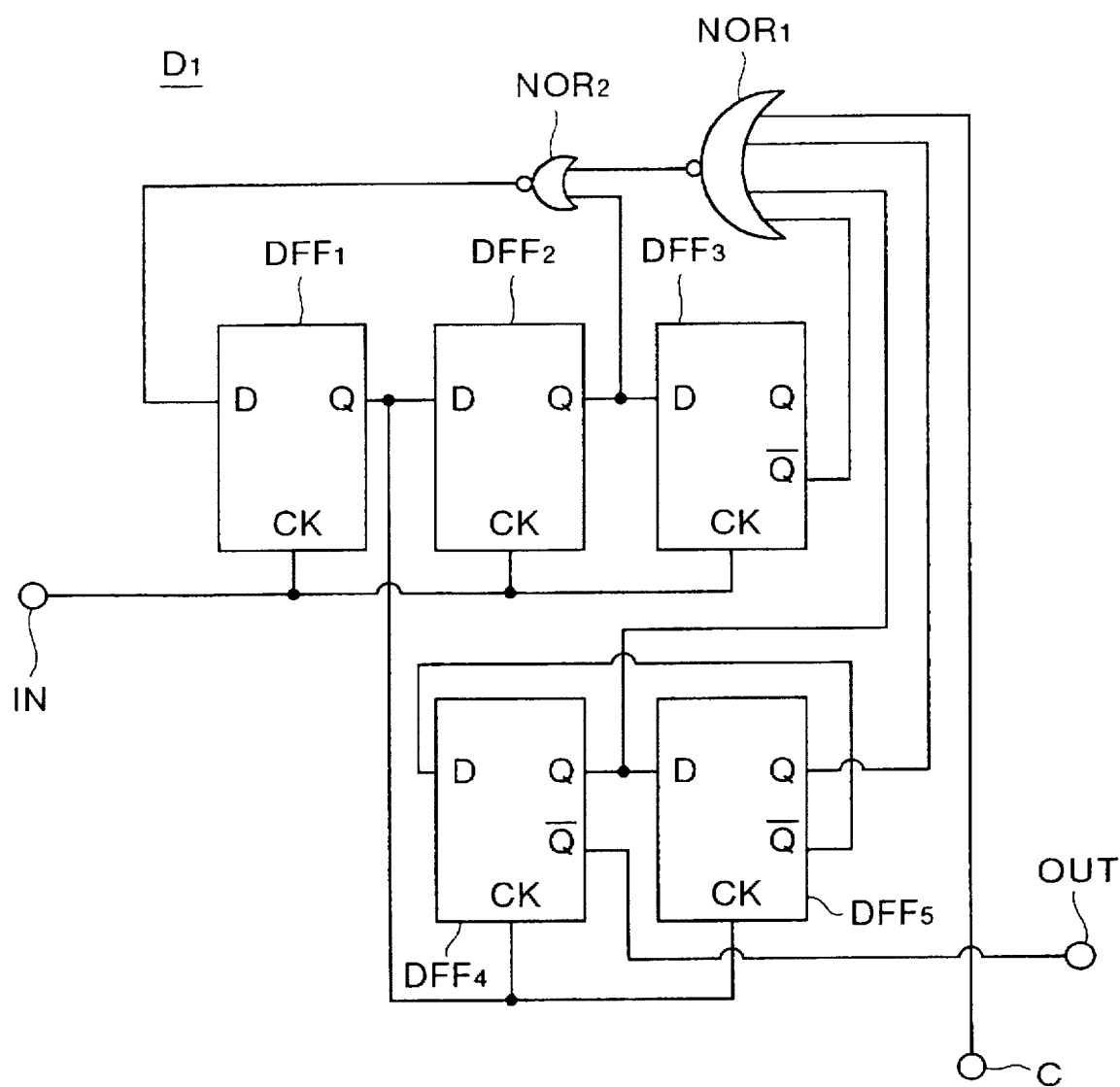
FIG. 4 is a diagram illustrating an exemplary configuration of a first frequency divider shown in FIG. 3.

FIG. 4 is a diagram illustrating a specific example of the circuit configuration for the first frequency divider D1. The illustrated configuration itself has been known. The first divider D1 is composed of five D-type flip-flops DFF1–DFF$_5$ and two NOR circuits NOR$_1$–NOR$_2$ which are connected as illustrated in FIG. 4.

In FIG. 4, when a control signal inputted to a frequency division control terminal C is at logical "H" ("1"), a signal outputted from the first NOR circuit NOR$_1$ and inputted to one input terminal of the second NOR circuit NOR$_2$ is fixed at logical "L". In this event, the second NOR circuit NOR$_2$ operates as an invertor circuit since a signal inputted to the other input terminal is fixed at logical "L".

Here, within the serially connected three D-type flip-flops DFF$_1$–DFF$_3$, an input terminal D of the first D-type flip-flop DFF$_1$ and an output terminal Q of the second D-type flip-flop DFF$_2$ are connected through the second NOR circuit NOR$_2$. More specifically an output terminal of the second NOR circuit NOR$_2$ is connected to the input terminal D of the first D-type flip-flop DDF$_1$, and the output terminal Q of the second D-type flip-flop DFF$_2$ serially connected to the first D-type flip-flop DFF$_1$ is connected to the other input terminal of the second NOR circuit NOR$_2$ signal which is to configure a divide-by-four circuit.

Similarly, within the serially connected two D-type flip-flops DFF$_4$–DFF$_5$, an input terminal D of the fourth D-type flip-flop DFF$_4$ is directly connected to an inverting output terminal $\overline{Q}$ of the fifth D-type flip-flop DFF$_5$ to configure a divide-by-four circuit. Then, the fourth and fifth D-type flip-flops DDF$_4$, DDF$_5$ are supplied at their respective clock input terminal CK with the output signal of the first D-type flip-flop DFF$_1$. Thus, a signal which is frequency-divided by 16 (first clock signal) is normally delivered at an inverting output terminal $\overline{Q}$ of the fourth D-type flip-flop DFF$_4$.

Also, as mentioned above, an output signal of the first NOR circuit NOR$_1$ is inputted to the one input of the second NOR circuit NOR$_2$. Also, signals from an inverting output terminal $\overline{Q}$ of the third D-type flip-flop DFF$_3$, output terminals Q of the fourth and fifth D-type flip-flops DFF$_4$, DFF$_5$, and the frequency division control terminal C are inputted to input terminals of the first NOR circuit NOR$_1$.

In this event, the first NOR circuit NOR$_1$ delivers an output signal at logical "H" when all of the above-mentioned inputs are at logical "L". When the output signal of the first NOR circuit NOR$_1$ goes to logical "H", an output signal of the second NOR circuit NOR$_2$ goes to logical "L". Thus, the output signal of the first NOR circuit NOR$_1$ is changed to logical "H" only during one clock cycle to cause the output timing to shift by one clock, whereby the frequency divider circuit composed of the D-type flip-flops DFF$_1$–DFF$_3$ performs a division-by-five operation.

Next, explanation will be give of the timing at which the output signal of the first NOR circuit NOR$_1$ is changed to logical "H" only during one clock cycle. This is a time period in which the fourth and fifth D-type flip-flops DFF$_4$, DFF$_5$ both output a logical "L" signal when a logical "L" control signal is being inputted from the frequency division control terminal C.

Specifically, the frequency divider circuit composed of the D-type flip-flops DFF$_1$–DFF$_3$ repeats three division-by-four operations and a division-by-five operation. Also, since the frequency divider circuit composed of the D-type flip-flops DFF$_4$, DFF$_5$ performs a frequency division operation to generate a pulse at every fourth pulse applied to the input thereof. Thus, as a whole, a division-by-17 operation is performed.

Since the first frequency divider D1 is configured as explained above, it performs a division-by-16 operation when the data of a data signal outputted from the data register L is at "1" and performs a division-by-17 operation when the data of the data signal outputted from the data register L is at "0".

Turning back to FIG. 3, the signal frequency-divided by 16 or 17 by the frequency divider D1 is supplied to the second frequency divider D2 and frequency-divided by eight. An output signal of the second divider D2 is then subjected to predetermined processing by the band-pass filter BPF and outputted therefrom as a FSK-modulated signal. The band-pass filter BPF acts to transform the waveform of a signal outputted as a FSK-modulated signal into a sinusoidal wave to limit its signal bandwidth.

Figure 5:
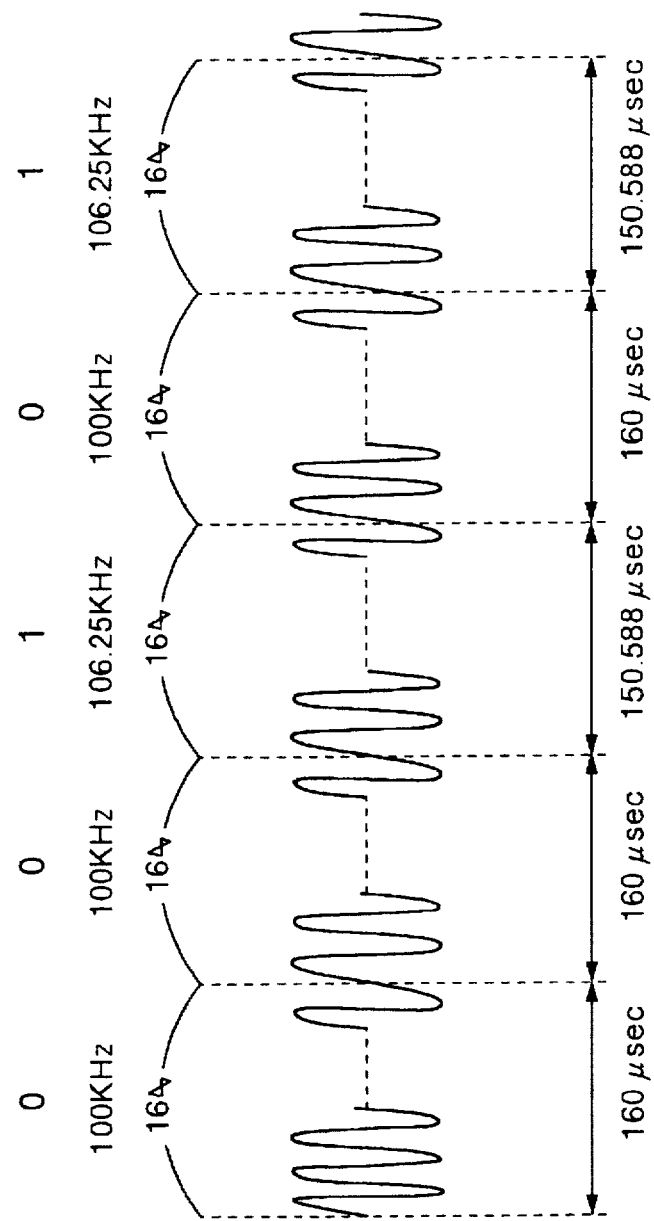
FIG. 5 is a waveform diagram of a FSK-modulated signal outputted from the FSK modulation apparatus illustrated in FIG. 3.

An exemplary waveform of a FSK-modulated signal according to this embodiment is illustrated in FIG. 5. As is apparent from FIG. 5, the FSK modulation apparatus outputs an output signal at frequency of 106.25 (13600÷16÷8) KHz when data of a data signal outputted from the data register L is at "1" and at frequency of 100 (13600÷17÷8) KHz when the data of the data signal outputted from the data register L is at "0". However, the number of waves, i.e., the number of cycles of the carrier signal included in one data signal is 16 for both cases irrespective of whether the data of the data signal is at "1" or "0". Therefore, a time period during which the FSK-modulated signal has a frequency of 100 KHz for representing data "0" is 160 μsec, while a time period during which it has a frequency of 106.25 KHz for representing data "1" is 150.588 μsec. Thus, the time periods are different from each other.

In other words, in this embodiment, a signal produced by frequency dividing the output signal of the second frequency divider D2 by 16 by the third frequency divider D3 is supplied to the clock terminal of the data register L as a timing signal, so that data to be outputted from the data register L is replaced with the next data every time 16 cycles of waveforms are outputted.

As described above in detail, in this embodiment, the FSK modulation is performed in accordance with data of a data signal, and a time period in which a constant frequency is continuous for every data is determined by the rate of frequency division of the third frequency divider D3.

Also, since the frequency of the output signal of the reference oscillator OSC is divided by switching the first frequency divider D1 to perform a division-by-16 or a division-by-17 operation, the phase is continuous when the frequency division rate is changed (i.e., when the frequency is changed). Further, since the output signal of the first frequency divider D1 is used as a clock signal for the system, the number of generated clock pulses is constant while data to be next transmitted (1 bit) is determined (160 μsec or 150.588 μsec). In the example illustrated in FIG. 3, this is 128 (8×16).

Thus, when the FSK-modulated signal generated as described above is applied, for example, to a contactless IC card, a FSK detector circuit (demodulation apparatus) in the contactless IC card can perform stable operations without the need for adjusting an oscillating frequency, and is more suitable for implementation as an integrated circuit since no externally attached parts are required thereto, thus making it possible to reduce cost.

According to the foregoing embodiment, only one oscillator is provided for generating a reference clock signal, and the reference clock signal (carrier signal) generated by this reference clock generator is inputted to a frequency divider circuit having two different rates of frequency division so that the rates of frequency division of the frequency divider circuit are switched in accordance with a data signal, thereby making it possible to achieve precise FSK modulation with different frequencies (frequency division rates) switched in accordance with the contents of a data signal, and to generate a FSK-modulated signal which has a continuous phase even at the transition of the rate of frequency division. This enables a FSK detector circuit for demodulating the FSK-modulated signal to perform stable operations without performing any adjustment to the oscillating frequency. In addition, since analog circuits such as a mixer circuit, a phase shifting circuit, and so on as well as externally attached parts are not required, the FSK detector circuit becomes more suitable for implementation in the form of integrated circuitry, and reduced cost can be achieved.

Figure 6:
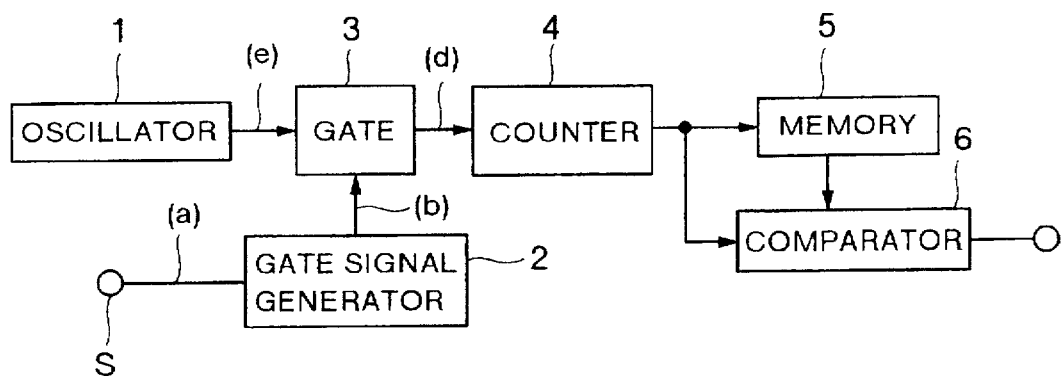
FIG. 6 is a block diagram illustrating a FSK demodulation apparatus according to one embodiment of the present invention.

FIG. 6 illustrates a FSK demodulation apparatus according to one embodiment of the present invention. The FSK demodulation apparatus comprises an oscillator (clock pulse source) 1, a gate signal generator 2, a gate 3, a counter 4, a memory 5, and a comparator 6.

In FIG. 6, a FSK-modulated input signal (a) applied from an input terminal S is supplied to the gate signal generator 2. A clock signal (c) from the oscillator 1 is inputted to a count input terminal of the counter 4 through the gate 3. A gate signal (b) from the gate signal generator 2 is supplied to a control terminal of the gate 3.

A count signal from the counter 4 is connected to a first input terminal of the comparator 6, and data read from the memory 5 is supplied to a second input terminal of the comparator 6.

The input signal supplied to the input terminal S is FSK-modulated, and each one bit data of the input signal includes, for example, 16 cycles of a carrier signal.

FIG. 7 shows waveform diagrams for explaining the operation of the FSK demodulation apparatus illustrated in FIG. 6.

In FIG. 7, (a) illustrates a FSK-modulated input signal waveform; (b) a gate signal generated by the gate signal generator 2; (c) a clock signal from the oscillator 1; and (d) an output of the gate 3. The input signal (a) includes a train of a plurality of signal portions ($H_1, H_2, \ldots$), each of which is at a first frequency when it represents a first logical level, and at a second frequency when it represents a second logical level, and the number of cycles included in each signal portion is constant.

The gate signal generator 2 generates the gate signal which has a gate pulse with a duration corresponding to four cycles of the input signal at an interval corresponding to one or two cycles of the input signal, as illustrated in FIG. 7.

Figure 1:
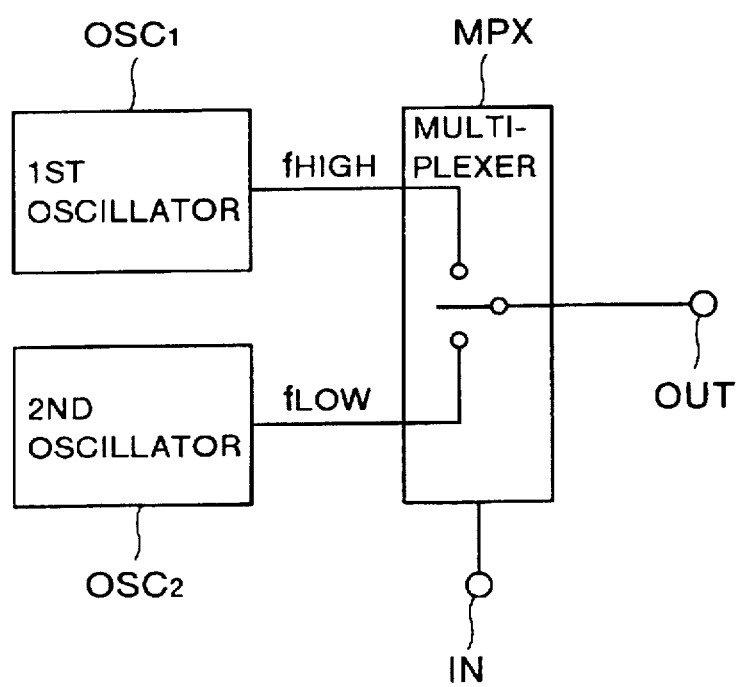
FIG. 1 is a diagram illustrating an example of a prior art FSK modulation apparatus.
Figure 2:
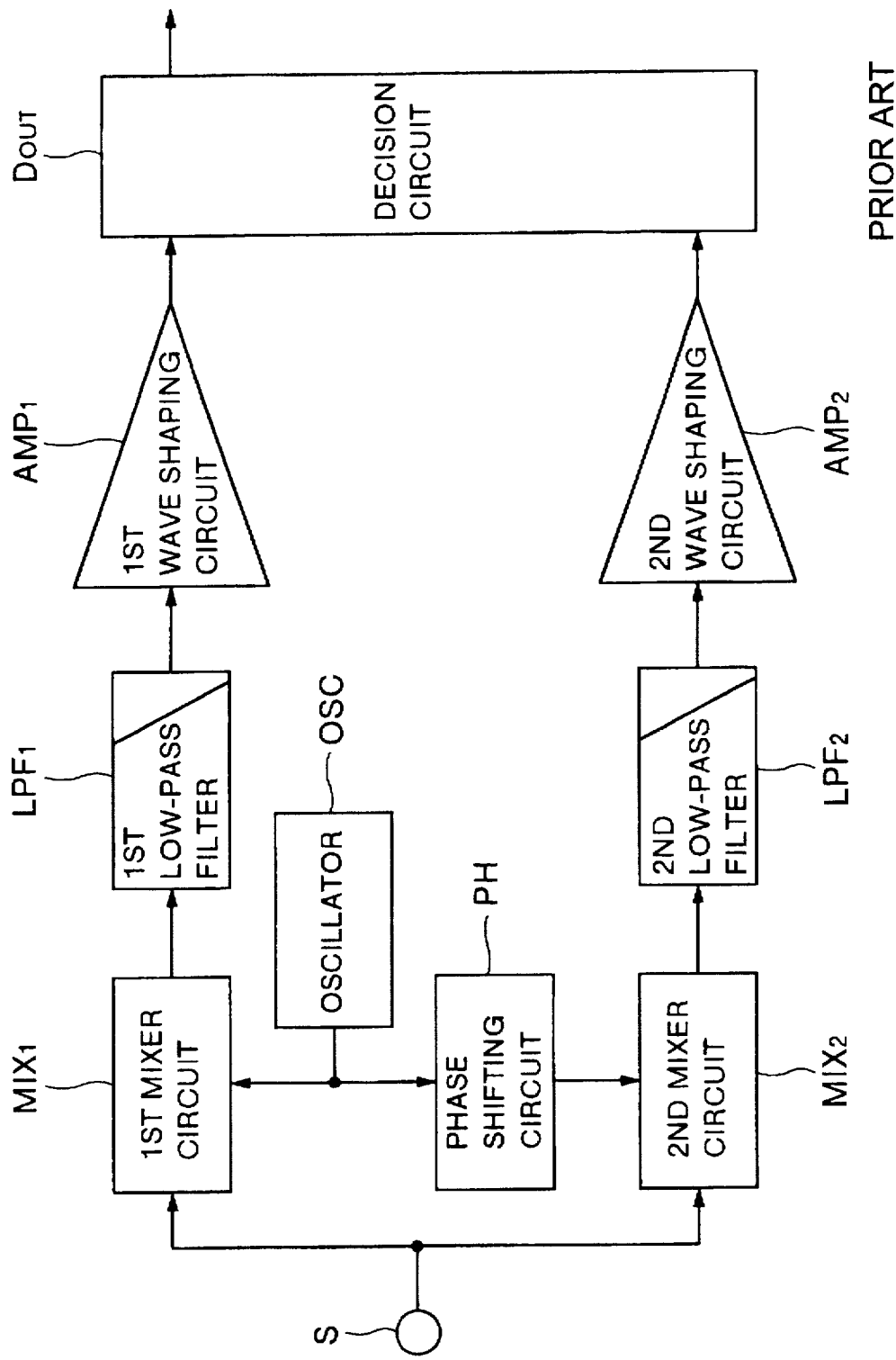
FIG. 2 is a diagram illustrating an example of a prior art FSK demodulation apparatus.

This corresponds to a FSK modulation cycle of the input signal including 16 cycles of the carrier signal. In other words, the gate signal (b) has a repetitive period corresponding to 16 cycles of the input signal by a combination of two intervals ($t_{11}, t_{21}, \ldots$) each corresponding to one cycle of the input signal, one interval ($t_{12}, t_{22}, \ldots$) corresponding to two cycles of the input signal, and three gate pulses ($t_{13}, t_{23}, \ldots$) each having a width corresponding to four cycles of the input signal. This is hereinafter called the "modulation cycle" (a period H1 in FIG. 2). The gate 3, which receives the gate signal (b) from the gate signal generator 2, becomes conductive while the gate signal (b) is at a high level to pass therethrough the clock pulse supplied from the oscillator 1 to the counter 4.

Thus, the counter 4 counts the output of the oscillator 1 only during the gate pulse durations included in the gate signal illustrated in FIG. 7 (b) to generate a count signal which is supplied to the memory 5 and to the comparator 6. The memory 5 stores count values $C_{21}, C_{22}, C_{23}$ represented by count signals for three pulses over one modulation cycle corresponding to the aforementioned one signal portion (generated by counting clock pulses during a time corresponding to the width of the gate pulse). The comparator 6 compares count values represented by the count signals, respectively supplied from the counter 4 during the modulation cycle corresponding to the next signal portion, with the count values stored in the memory 5 in each corresponding gate pulse duration. Stated another way, the count values $C_{21}, C_{22}, C_{23}$ illustrated in FIG. 7(d) are compared with count values $C_{11}, C_{12}, C_{13}$ of the preceding modulation cycle period. Since the higher carrier frequency $F_{HIGH}$ at which the input signal is FSK-modulated produces a different count value from the lower carrier frequency $F_{LOW}$ by four or more, as described later, these count values may be discriminated to determine whether an associated input signal is at the higher frequency $F_{HIGH}$ or the lower frequency $F_{LOW}$ of the FSK-modulated carrier frequency.

The frequencies will be next described in detail.

In the example illustrated in FIG. 6, assuming that an input signal is FSK-modulated with an associated carrier frequency switched between $F_{HIGH}$ and $f_{LOW}$, the oscillating frequency $f_0$ of the oscillator 1 is set to satisfy the following equation:

$$N \times (f_0/f_{LOW} - f_0/f_{HIGH}) \geq 6 \qquad (1)$$

where N is the number of cycles of the input signal corresponding to the width of a gate pulse in the gate signal and is four in this example; $F_{HIGH}$ is the higher carrier frequency at which the input signal is FSK-modulated; and $F_{LOW}$ is the lower carrier frequency at which the input signal is FSK-modulated.

In the example illustrated in FIG. 6, since the oscillator 1 is not synchronized with the input signal, a count error having a width of ±1 occurs in each count result. Thus, even if the frequency of the input signal is constant for each data, a difference of two may be present at maximum in the count result. It is therefore necessary to set the higher frequency $F_{HIGH}$ and the lower frequency $F_{LOW}$ so as to produce a difference of three or more, at minimum, between the count results when the frequency of the input signal is changed. In other words, it is necessary to satisfy a condition for ensuring a significant difference even in the worst case when the occurrence of error is determined. i.e., the value on the right side of equation (1) being five or more. In addition, the value on the right side of equation (1) is set to six to leave a margin for drift of the oscillator 1. More specifically, the difference between the counts corresponding to the higher carrier frequency and the lower carrier frequency is four or more.

Here, more specific exemplary numerical values are given to the example illustrated in FIG. 6 for explanation. The condition expressed by equation (1) can be satisfied when $f_0=900$ kHz with $F_{HIGH}=120$ kHz, $F_{LOW}=100$ kHz, and $N=4$.

In this case, a count value of the counter 4 reaches 30 $(900 \div 120 \times 4) \pm 1$ when $F_{HIGH}$ is inputted, and 36 $(900 \div 100 \times 4) \pm 1$ when $F_{LOW}$ is inputted. Since there is a difference of four or more (=35−31) between the count values (and hence there is a difference of three or more), the determination can be made.

In addition, a margin of one count (4−3) (1/36=2.8% in term of the oscillating frequency) is ensured for temporary drift of the oscillating frequency $f_0$ of the oscillator 1.

Specifically, the above value is a tolerance for drift within a time period equal to twice the modulation cycle (in this example, 133–160 μsec) of the FSK modulation performed on the input signal, and it is quite easy to limit the drift of the oscillating frequency $f_0$ to 1/36=2.8% or less within a short term.

Even if the oscillating frequency $f_0$ largely fluctuates in amount to ten times, the foregoing condition is still easy to satisfy although requirements to the short term drift becomes more strict in correspondence to the increase.

For long term drift, there is no problem since the comparison for the determination is made always based on new count values. Thus, the oscillator 1 hardly imposes any limitations to the FSk demodulation with respect to the stability of the oscillating frequency $f_0$. It is therefore possible to employ an oscillator circuit which can be readily incorporated in an integrated circuit, particularly without requiring any externally attached parts, for example, a ring oscillator, a multivibrator, or the like.

In the FSK demodulation apparatus described above, count values counted by the counter 4 during four cycles of an input signal are sequentially compared to detect that the input frequency is not changed if there is no significant difference (four or more) between the current count value and a count value in the preceding modulation cycle at the same phase, and to detect that the input frequency has been changed in accordance with the contents of a change if there is a significant difference (four or more).

Here, each count value is not compared with the preceding count value but with a count value in the preceding modulation cycle so as not to compare a count value derived from an input signal in a transient state immediately after the frequency has been changed in the modulation cycle with a count value derived from an input signal in a converged state.

The FSK detecting operation may be carried out even if each count value is simply compared with the preceding count value in sequence.

In this case, a response to a determination is delayed if it is made when an input signal in a transient state is counted. However, since the determination is made three times during a modulation cycle, the detection is possible.

Figure 13:
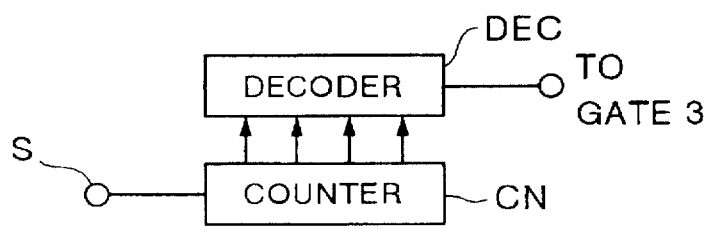
FIG. 13 is a block diagram illustrating an example of a gate signal generator.

FIG. 13 illustrates the configuration of the gate signal generator 2. A binary counter CN including four stages of flip-flops counts the number of cycles of a FSK-modulated input signal. An output at each stage is supplied to a decoder DEC, and the decoder DEC generates gate pulses based on count values of 0, 1, 2, 3, count values of 5, 6, 7, 8, and count values of 10, 11, 12, 13 for one modulation cycle.

Figure 8:
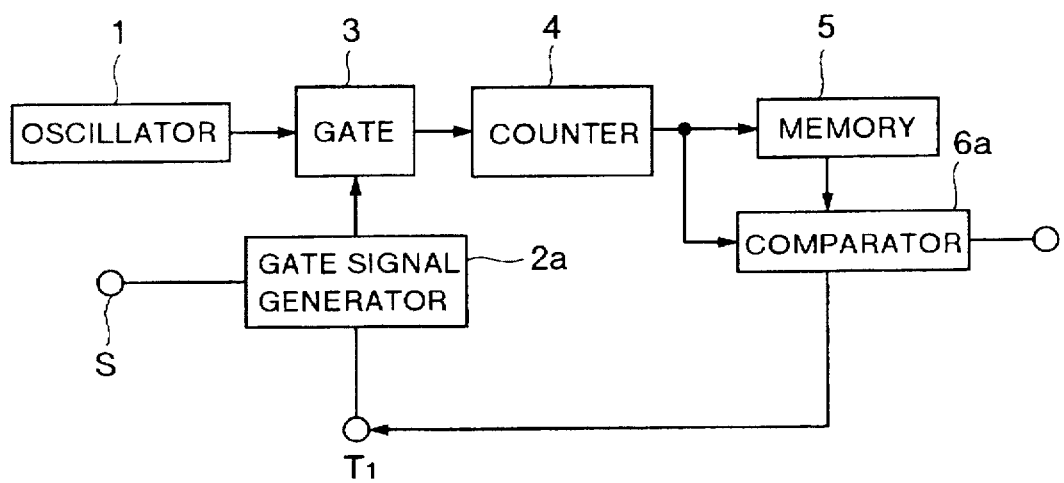
FIG. 8 is a block diagram illustrating a FSK demodulation apparatus according to another embodiment of the present invention.

FIG. 8 illustrates another embodiment of a FSK modulation apparatus. Unlike the example illustrated in FIG. 6, when a comparator 6a detects detection fault, a detection fault signal is fed back to an operation timing control terminal T1 of a gate signal generator 2a to control the operation timing of the gate signal generator 2a to temporarily and forcedly extend the interval of a gate pulse having a time width corresponding to four cycles of an input signal S. For example, $t_{12}$, which has a width corresponding to two cycles in FIG. 7, can be extended to a width corresponding to three–four cycles to shift the operation timing.

While the embodiment illustrated in FIG. 8 is identical in that one FSK modulation cycle of the input signal includes 16 cycles of a carrier signal, the synchronization relationship is shifted when the operation is not clearly determined due to detection of a transient portion of the FSK modulation. The example of FIG. 6 copes with this problem by performing three count/comparison operations during one modulation cycle, whereas the selection of an optimal point achieved by positively shifting the operation timing, as described above, results in a reduced number of times of the operations during one modulation cycle, thereby effectively reducing consumed current.

Figure 9:
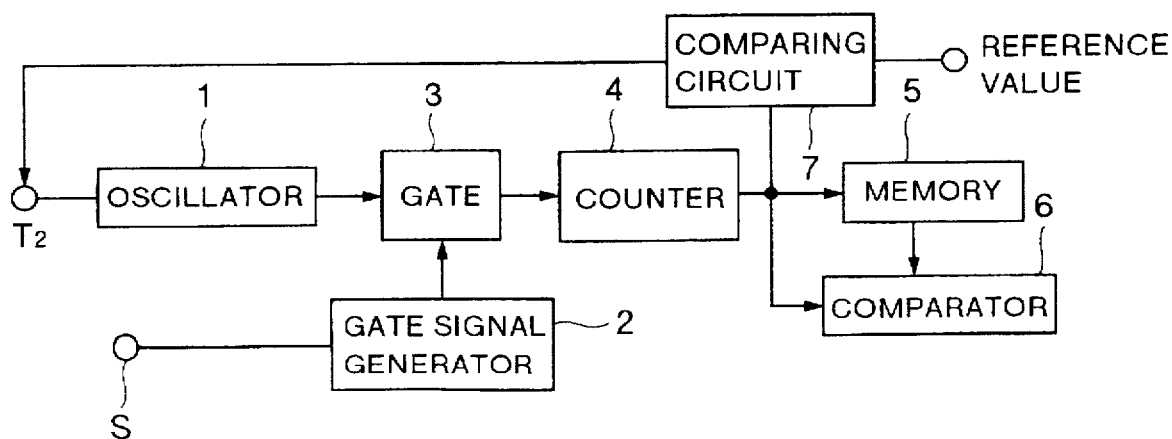
FIG. 9 is a block diagram illustrating a FSK demodulation apparatus according to a further embodiment of the present invention.

FIG. 9 illustrates another embodiment of a FSK demodulation apparatus. Unlike the example illustrated in FIG. 6, the oscillating frequency $f_0$ of the oscillator 1 can be adjusted, although in a rough manner. While the oscillating frequency $f_0$ of the oscillator is only required to satisfy equation (1) from the viewpoint of the FSK demodulation operation, the oscillating frequency $f_0$ may be in some cases higher than necessary due to, for example, variations in manufacturing. In such a case, the satisfaction of equation (1) only causes a disadvantage that a consumed current is increased, so that the oscillating frequency $f_0$ can be automatically adjusted, although roughly, by an unnecessarily high portion. Count values of the counter 4 are supplied to the comparator 6 similarly to the aforementioned embodiment, and additionally supplied to another input terminal of the comparator 7 which is supplied at one input terminal with a reference value. An output of the comparator 7 is fed back to an oscillating frequency control terminal T2 to roughly control the oscillating frequency $f_0$ of the oscillator 1 such that counted results substantially fall under a reference value range.

A method of roughly controlling the oscillating frequency $f_0$ of the oscillator 1 may be achieved, for example, by composing the oscillator of a current controlled ring oscillator and controlling an operating current applied thereto.

Figure 10:
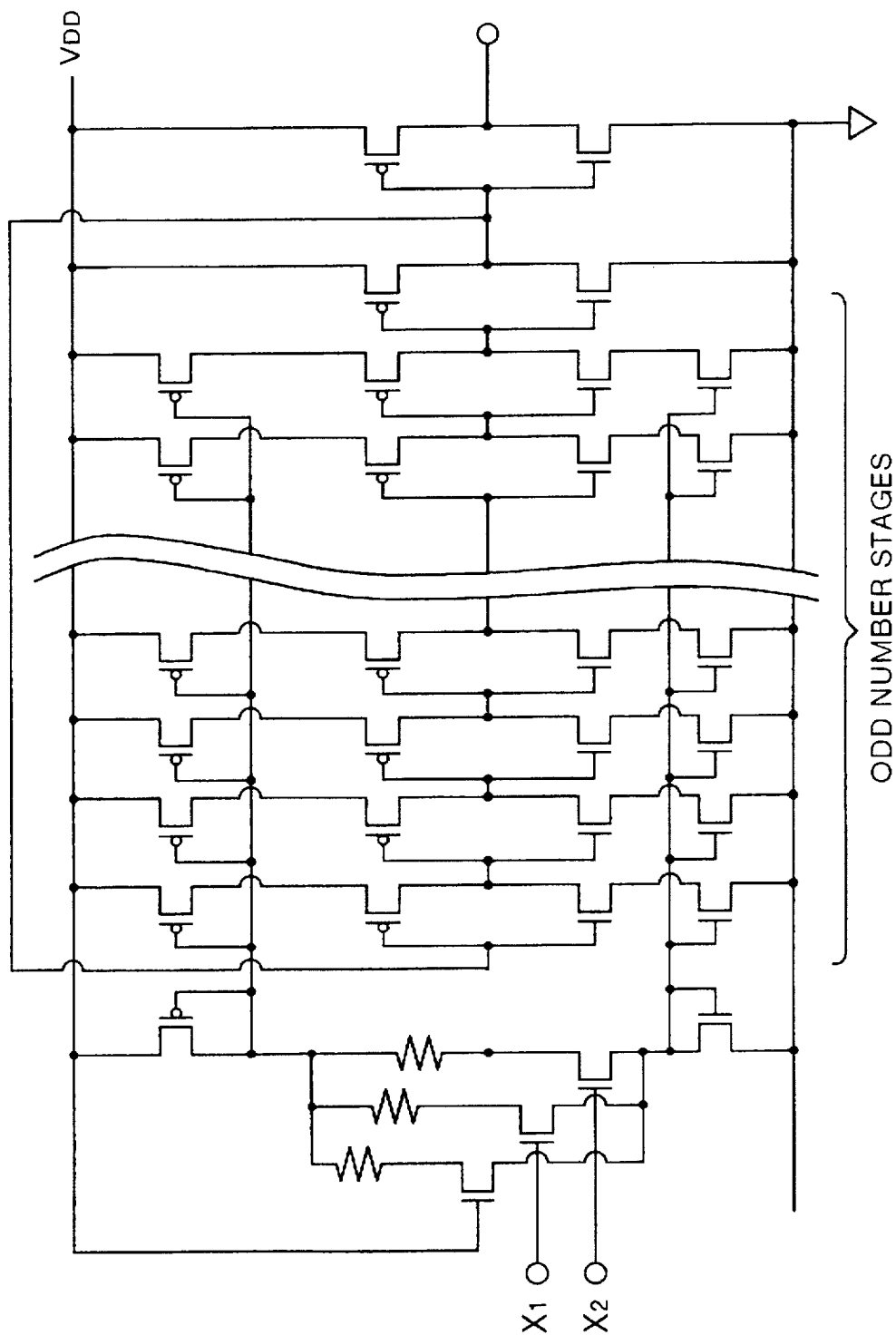
FIG. 10 is a circuit diagram illustrating an example of an oscillator which can be employed in the embodiments of the present invention.

FIG. 10 illustrates a current controlled ring oscillator as an exemplary configuration of the oscillator 1. In FIG. 10, the oscillating frequency is controlled by control voltages applied to first and second current control terminals $X_1$, $X_2$. As described above, the example of FIG. 9 controls the oscillating frequency $f_0$ of the oscillator 1 to reduce a consumed current.

Figure 11:
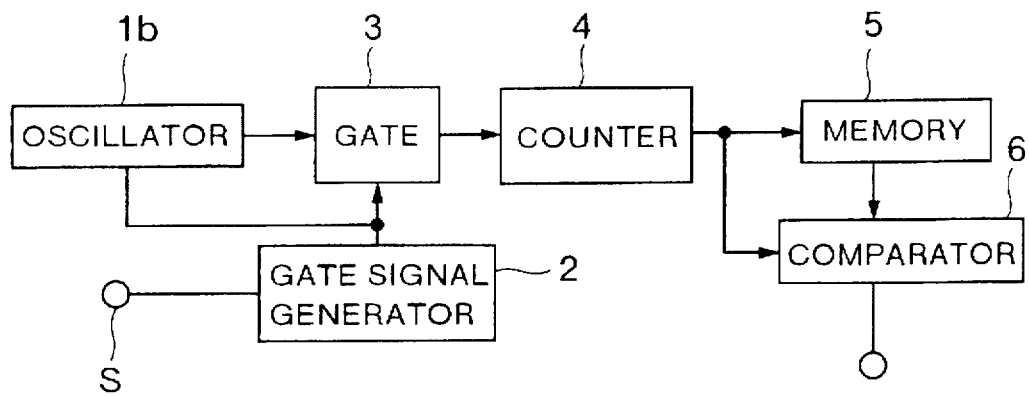
FIG. 11 is a block diagram illustrating a FSK demodulation apparatus according to a further embodiment of the present invention.

FIG. 11 illustrates another embodiment of a FSK demodulation apparatus. Unlike the example illustrated in FIG. 6, this is an example of controlling the oscillating operation of an oscillator 1b using a gate signal from a gate signal generator 2. The gate signal of the gate signal generator 2 is inputted to a trigger terminal for controlling the oscillation of the oscillator 1b to start, such that the oscillator 1b outputs clocks only during gate pulse durations of the gate signal. In this example, since the oscillating operation of the oscillator 1b can be forcedly synchronized with an input signal, a shift swing of count values provided by a counter 4 can be reduced from ±1 to +0/−1. As a result, the condition given by the aforementioned Equation (1) becomes easier. Specifically, the value on the right side can be reduced from six to four. In addition, since the oscillator 1b outputs clocks only during gate pulse durations of the gate signal in this embodiment, the gate 3 can be omitted.

When this embodiment is applied to an example for explaining the embodiment of FIG. 6, the oscillating frequency $f_O$ of the oscillator 1b can be reduced from 900 kHz to 600 kHz. Since the oscillating frequency $f_O$ of the oscillator 1 can be reduced in this way, thus a consumed current can be effectively reduced.

Figure 12:
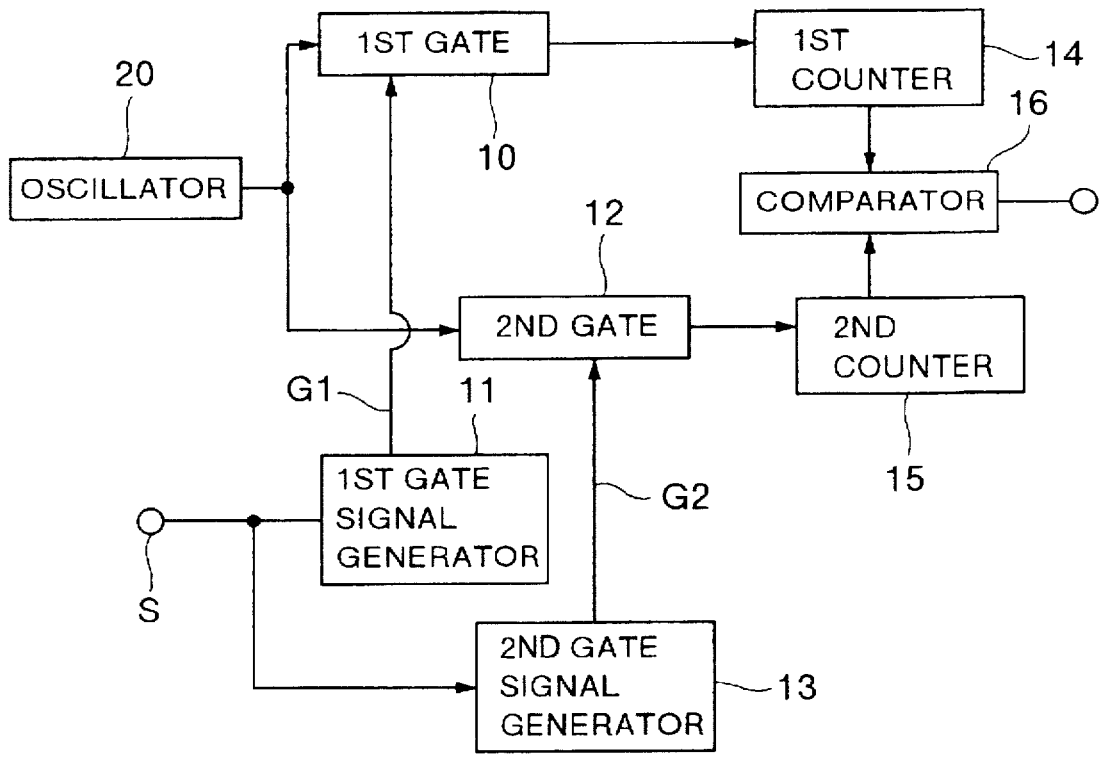
FIG. 12 is a block diagram illustrating a FSK demodulation apparatus according to a further embodiment of the present invention.

FIG. 12 illustrates another embodiment of a FSK demodulation apparatus. The example illustrated in FIG. 12 is an embodiment optimized for demodulation of a FSK-modulated signal, where one of frequencies $f_{HIGH}$ and $F_{LOW}$ of a FSK-modulated input signal does not continue more than a reference value and the generation probabilities of the frequencies are substantially equal when considering them in a set modulation cycle or more.

In FIG. 12, an input signal supplied to an input terminal S is applied to first and second gate signal generators 11, 13. An output (clock pulse signal) of an oscillator 20 is supplied to count input terminals of first and second counters 14, 15 through first and second gates 10, 12, respectively. Outputs (gate signals) of the first and second gate signal generators 11, 13 are connected to control terminals of the first and second gates 10, 12, respectively, and count signals from the first and second counters 14, 15 are both applied to a comparator 16.

Here, the first gate signal generator 11 repetitively generates a gate signal G1 including a gate pulse having a time width corresponding to four cycles of the input signal at intervals of one to two cycles of the input signal. This is because the operation is repeated ever 16 cycles of the input signal corresponding to the FSK modulation cycle of the input signal which is made up of 16 cycles of the carrier signal, similarly to the example illustrated in FIG. 6.

The second gate signal generator 13, in turn, repetitively generates a gate signal G2 having a time width corresponding to 64 cycles of the input signal. Specifically, the example illustrated in FIG. 12 corresponds to the case where the carrier is FSK-modulated by such a data signal that does not include four or more consecutive binary data which are not identical. Thus, signals at $F_{HIGH}$ and $F_{LOW}$ are necessarily inputted at least once if four modulation cycles, i.e., 64 (16×4) cycles of the input signals are extracted, so that the gate signal G2 is generated at the timing shifted from the gate signal G1 by 16×4=64 cycles.

The first and second counters 14, 15, which receive the gate signals G1, G2 shifted by 64 cycles from each other, count clock pulses supplied from the oscillator 20 during gate pulse durations of the respective gate signals, and supply count values to the comparator 16. The comparator 16 compares the count values of the first and second counters 14, 15 in magnitude to determine whether a signal inputted at that time has the carrier signal at the higher frequency $fH_{IGH}$ or at the lower frequency $F_{LOW}$.

To enable the determination, the oscillating frequency $f_1$ of the oscillator 20 is set to satisfy following Equation (2):

$$16(f_1/f_{LOW} - f_1/f_{HIGH}) \geq 33 \qquad (2)$$

where $f_1$ is the oscillating frequency of the oscillator 20; $F_{HIGH}$ is the higher carrier frequency at which the input signal is FSK-modulated; and $F_{LOW}$ is the lower carrier frequency at which the input signal is FSK-modulated.

Now, more specific exemplary numerical values are given to the example illustrated in FIG. 12 for further explanation. The condition expressed by Equation (2) can be satisfied by setting $f_1=1.5$ MHz when $F_{HIGH}=120$ kHz, $F_{LOW}=100$ kHz, and N=4.

In this case, a count value of the first counter 14 reaches 50 (1500÷120×4)±1 when $F_{HIGH}$ is inputted, and a count value of the first counter 14 reaches 60 (1500÷100×4)±1 when $F_{LOW}$ is inputted.

A count value of the second counter 15 reaches:

$$840 \pm 1 \qquad (3)$$

when $F_{HIGH}$ is inputted three times and $F_{LOW}$ is inputted once in a modulation cycle. A count value of the second counter 15 reaches:

$$920 \pm 1 \qquad (4)$$

when $F_{HIGH}$ is inputted once and $F_{LOW}$ is inputted three times in a modulation cycle. When the counted result of the counter circuit 14 is read after it is shifted four digits in the upper direction, a count value of the first counter 14 reaches:

$$800 \pm 16 \qquad (5)$$

when $F_{HIGH}$ is inputted in a modulation cycle, and a count value of the first counter 14 reaches:

$$960 \pm 16 \qquad (6)$$

when $F_{LOW}$ is inputted in a modulation cycle.

Thus, there is a difference of 23 or more between the count value (5) of the first counter 14 and the count value (3) of the second counter 15, and similarly, there is a difference of 23 or more between the count value (6) of the first counter 14 and the count value (4) of the second counter 15, whereby the determination can be made.

Since the difference between the count value (5) of the first counter 14 and the count value (4) of the second counter 15, and the difference between the count value (6) of the first counter 14 and the count value (3) of the second counter 15 are larger, the determination can be made more easily.

In addition, a margin of one count (1/60=1.7% in term of the oscillating frequency) or more is ensured for short term drift of the oscillating frequency $f_1$ of the oscillator 20. Specifically, the above value is a tolerance for drift within a time period equal to twice the modulation cycle (in this example, 133–160 μsec) of the FSK modulation performed on the input signal, and it is quite easy to limit the drift of the oscillating frequency $f_1$ to 1/60=1.7% or less within a short term.

Even if the oscillating frequency $f_1$ fluctuates, the count values also vary correspondingly, so that no problems will occur as long as the condition of Equation (2) is satisfied. For long term drift, there is no problem since the comparison for the determination is made always based on new count values. Thus, the oscillator 20 hardly imposes any limitations to the FSk demodulation with respect to the stability of the oscillating frequency $f_1$. It is therefore possible to employ an oscillator circuit which can be readily incorporated in an integrated circuit, particularly without requiring any externally attached parts, for example, a ring oscillator, a multivibrator, or the like.

According to this embodiment, since the demodulation apparatus can be composed of circuits which can be easily manufactured into an integrated circuit by CMOS processes, the demodulation apparatus is more easily integrated into a one-chip configuration simultaneously with logic circuits, memory circuits, and so on.

Since the foregoing FSK demodulation apparatus is configured and operates as described above, it can be composed of circuits which can be easily manufactured into an integrated circuit by CMOS processes, so that it is more easily integrated into a one-chip configuration simultaneously with logic circuits, memory circuits, and so on. In addition, since the FSK demodulation apparatus has no parts requiring adjustments, its operation is stable, and reduced cost is achieved.

What is claimed is:

1. A frequency shift keying modulation apparatus comprising:
    a reference clock generator;
    a variable frequency divider for frequency dividing a reference clock outputted from said reference clock generator by switching a rate of frequency division to selectively switch and generate a first clock signal and a second clock signal at a frequency different from that of said first clock signal such that said first and second clock signals are continuous in phase;
    a data register connected to said frequency divider for storing data and for generating a control signal based on said data, said control signal being supplied to said variable frequency divider such that the rate of frequency division of said variable frequency divider is switched by said control signal; and
    a frequency switching timing controller for frequency dividing an output signal of said variable frequency divider and for determining, based on the frequency divided signal, timing at which said control signal is supplied from said data register to said variable frequency divider,
    wherein said frequency switching timing controller controls the switching timing of the rate of frequency division so as to equal the numbers of waves corresponding to said data.

2. A frequency shift keying modulation apparatus comprising:
    a binary data signal source capable of supplying a binary data signal containing a sequence of binary data, each of said binary data having one of first and second logical levels;
    a carrier generator for generating a carrier signal;
    a first frequency divider having a variable rate of frequency division, said first frequency divider being connected to receive said carrier signal from said carrier generator and a binary data signal from said binary data signal source to produce a frequency-modulated signal having a first frequency when said received binary signal is at the first logical level and a second frequency when said received binary signal is at the second logical level; and
    a second frequency divider for frequency dividing said frequency-modulated signal from said first frequency divider to generate a timing signal, said timing signal being supplied to said binary data signal source to determine a first time period of the first logical level binary data contained in said binary data signal to be received by said first frequency divider and a second time period of the second logical level binary data contained in said binary data signal to be received by said first frequency divide in such a manner that a number of cycles of said carrier signal appearing during said first time period is equal to a number of cycles of said carrier signal appearing during said second time period.

3. An apparatus according to claim 2, wherein said carrier signal is continuous in phase between said first and second time periods.

4. A FSK demodulation apparatus for demodulating a FSK-modulated input signal including binary data information represented by a combination of signals at first and second different frequencies, comprising:
    an oscillator;
    a gate for selectively supplying an output of said oscillator to a count input terminal of a counter in accordance with a gate signal;
    a gate signal generator for generating said gate signal having a width corresponding to an integer number of cycles of said input signal; and
    a comparator for determining whether said input signal is the signal at said first frequency or the signal at said second frequency in accordance with a count value of said counter.

5. A FSK demodulation apparatus according to claim 4, wherein:
    the oscillating frequency of said oscillator is a frequency twice or more of the higher one of said first and second frequencies of said input signal; and
    said gate signal generator outputs a gate signal having a width corresponding to an integer number of cycles of an output signal of said oscillator.

6. A FSK demodulation apparatus according to claim 4, wherein:
    said oscillator is ON-OFF controlled in synchronism with the output of said gate signal generator.

7. A FSK demodulation apparatus according to claim 4, further comprising means for shifting timing at which said gate signal generator performs a generating operation.

8. A FSK demodulation apparatus according to claim 4, further comprising means for adjusting the oscillating frequency of said oscillator in accordance with a count result of said counter.

9. A FSK demodulation apparatus according to claim 4, wherein the number of cycles of the FSK-modulated input signal corresponding to a cycle of ON-OFF repeating operation of the gate signal generated by said gate signal generator is equal to the number of or to 1/k time the number of cycles of the FSK-modulated input signal contained in a modulated cycle of the FSK-modulated input signal (k being an integer).

10. A FSK demodulation apparatus according to claim 4, wherein said comparator utilizes upper bits of a count result of said counter to make the determination.

11. A FSK demodulation apparatus comprising:
    an oscillator;
    first and second counters connected to said oscillator through first and second gates, respectively;
    a first gate signal generator for outputting a gate signal having a width corresponding to N cycles of an input signal to said first counter, said N being an integer;
    a second gate signal generator for outputting a gate signal having a width corresponding to M cycles of the input signal to said second counter, said M being an integer different from N; and
    a comparator for comparing outputs of said first and second counters.

12. A FSK demodulation apparatus according to claim 11, wherein:
    a predetermined offset value is set to said first or second counter so as to start a count from said offset value.

13. A FSK demodulation apparatus according to claim 11, wherein:

said first and second gate signal generators further includes means for changing a pulse width of the gate signal by a set time.

14. A FSK demodulation apparatus according to claim 11, wherein the number of cycles of the input signal corresponding to the gate signal generated by said first gate signal generator is set to 1/k time the number of cycles of the carrier signal for one cycle of the modulation cycle of the FSK-modulated input signal (k being an integer), and the number of cycles of the input signal corresponding to the gate signal generated by said second gate signal generator is set to an integral multiple of the number of cycles of the carrier signal for one cycle of the modulation cycle of the FSK-modulated input signal.

15. A FSK demodulation apparatus according to claim 11, wherein said comparator compares upper bits of count results of said first and second counters.

16. An apparatus for demodulating a FSK (frequency shift keying)-modulated signal carrying binary data information containing first and second logical level data, said modulated signal including a sequence of signal portions each being at a first frequency when representing a first logical level data of said information and at a second frequency when representing a second logical level data of said information, a number of cycles of said modulated signal contained in each of said signal portions at said first frequency representing said first logical level data being equal to that contained in each of said signal portions at said second frequency representing said second logical level data, the apparatus comprising:

a clock pulse source for generating a clock pulse signal including a train of clock pulses;

a gate connected to receive said clock pulse signal from said clock pulse source;

a gate signal generator connected to receive said FSK-modulated signal and to generate a gate control signal, said gate control signal containing a first predetermined number of first gate pulses for each of the signal portions of said modulated signal at said first frequency and the first predetermined number of second gate pulses for each of the signal portions of said modulated signal at said second frequency, each of said first gate pulses having a first duration concurrent with a second predetermined number of cycles of said modulated signal at said first frequency, each of said second gate pulses having a second duration concurrent with said second predetermined number of cycles of said modulated signal at said second frequency, said gate being rendered conductive when any of said first and second gate pulses appears in said gate control signal to pass therethrough said clock pulses from said clock pulse source;

a counter connected to receive those of said clock pulses which have passed through said gate and generate a count signal for each of said first and second gate pulses;

a memory connected to receive said count signal from said counter and store values represented by said count signal; and a comparator connected to said memory and said counter for comparing a value represented by a count signal received from said counter for one of the gate pulses for a first one of said signal portions of said modulated signal and a value read out from said memory and represented by a count signal for one of the gate pulses for a second one of said signal portions of said modulated signal, said one gate pulse for said first signal portion being associated with said one gate pulse for said second signal portion, said first signal portion being immediately following said second signal portion in the modulated signal.

* * * * *